(12) United States Patent
Roohparvar et al.

(10) Patent No.: US 6,667,932 B2
(45) Date of Patent: Dec. 23, 2003

(54) SYNCHRONOUS FLASH MEMORY WITH VIRTUAL SEGMENT ARCHITECTURE

(75) Inventors: Frankie Fariborz Roohparvar, Milpitas, CA (US); Kevin C. Widmer, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/368,874

(22) Filed: Feb. 19, 2003

(65) Prior Publication Data
US 2003/0128619 A1 Jul. 10, 2003

Related U.S. Application Data

(62) Division of application No. 09/928,621, filed on Aug. 13, 2001.

(51) Int. Cl.$^7$ ................................................. G11C 8/00
(52) U.S. Cl. ..................... 365/230.03; 365/230.08; 365/230.09; 365/185.11
(58) Field of Search ........................ 365/230.03, 230.08, 365/230.09, 185.11

(56) References Cited

U.S. PATENT DOCUMENTS

| | | |
|---|---|---|
| 5,732,029 A | 3/1998 | Lee |
| 5,831,929 A | 11/1998 | Manning |
| 5,978,302 A | 11/1999 | Merritt |
| 6,021,087 A | 2/2000 | Bosshart |
| 6,026,465 A | 2/2000 | Mills |
| 6,044,032 A | 3/2000 | Li |
| 6,055,202 A | 4/2000 | Merritt |
| 6,081,477 A | 6/2000 | Li |
| 6,108,745 A | 8/2000 | Gupta |
| 6,154,418 A | 11/2000 | Li |
| 6,246,626 B1 | 6/2001 | Roohparvar |
| 6,278,654 B1 * | 8/2001 | Roohparvar ............. 365/238.5 |
| 6,304,510 B1 | 10/2001 | Nobunaga |
| 6,307,795 B1 | 10/2001 | Blodgett |
| 6,314,030 B1 | 11/2001 | Keeth |
| 6,392,950 B2 | 5/2002 | Ayukawa et al. |
| 6,442,076 B1 | 8/2002 | Roohparvar |
| 6,452,851 B1 | 9/2002 | Endo |
| 6,496,425 B1 | 12/2002 | Abedifard |

FOREIGN PATENT DOCUMENTS

| | | |
|---|---|---|
| EP | 1 063 652 A2 | 12/2000 |
| WO | WO 00 67128 | 11/2000 |
| WO | WO 01 75897 A2 | 10/2001 |

* cited by examiner

*Primary Examiner*—Richard Elms
*Assistant Examiner*—Toan Le
(74) *Attorney, Agent, or Firm*—Leffert Jay & Polglaze, P.A.

(57) ABSTRACT

An improved memory device and architecture has been detailed that enhances a Flash memory device that has an SDRAM compatible interface. The memory device employs a virtual paging scheme that allows the memory to have an efficient Flash internal structure, while logically re-mapping this architecture externally to a compatible virtual SDRAM architecture. This allows for access and operation of the improved memory device with a compatible SDRAM controller device, while Flash specific functions can be performed with an SDRAM command sequence. Internal to the memory, memory array banks are divided into four equal segments by row range and logically re-mapped by placing the segments virtually beside each other. This forms a virtual memory bank structure of equivalent rows and columns as a comparable SDRAM device. Additionally, the improved memory device may also have an extended interface that allows for direct access to the internal Flash memory architecture without logical abstraction.

20 Claims, 8 Drawing Sheets

SYNCHRONOUS FLASH MEMORY WITH VIRTUAL SEGMENT ARCHITECTURE

RELATED APPLICATION

This is a divisional application of U.S. patent application Ser. No. 09/928,621, filed Aug. 13, 2001, titled "SYNCHRONOUS FLASH MEMORY WITH VIRTUAL SEGMENT ARCHITECTURE" and commonly assigned, the entire contents of which are incorporated herein by reference.

TECHNICAL FIELD OF THE INVENTION

The present invention relates generally to non-volatile memory devices and in particular the present invention relates to synchronous non-volatile flash memory with virtual segment architecture.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Both RAM and ROM random access memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external application of multiple column addresses. To increase access time, a burst mode access has been implemented. The burst mode uses an internal column address counter circuit to generate additional column addresses. The address counter begins at an externally provided address and advances in response to an external clock signal or a column address strobe signal.

A synchronous DRAM (SDRAM) is a type of DRAM that can run at much higher clock speeds than conventional DRAM memory. SDRAM synchronizes itself with a CPU's bus and is capable of running at 100 MHZ or 133 MHZ, about three times faster than conventional FPM (Fast Page Mode) RAM, and about twice as fast EDO (Extended Data Output) DRAM and BEDO (Burst Extended Data Output) DRAM. An extended form of SDRAM that can transfer a data value on the rising and falling edge of the clock signal is called double data rate SDRAM (DDR SDRAM, or simply, DDR). SDRAM's can be accessed quickly, but are volatile. Many computer systems are designed to operate using SDRAM, but would benefit from non-volatile memory. A synchronous Flash memory has been designed that allows for a non-volatile memory device with an SDRAM interface. Although knowledge of the function and internal structure of a synchronous Flash memory is not essential to understanding the present invention, a detailed discussion is included in U.S. patent application Ser. No. 09/627,682 filed Jul. 28, 2000 and titled, "Synchronous Flash Memory," which is commonly assigned and incorporated by reference.

In general, the goal of synchronous Flash is to mimic the architecture of SDRAM. It has an SDRAM interface which is compatible to SDRAM for read operation to the synchronous Flash memory. Programming, erasing, block protection and other flash specific function differ from SDRAM and are performed with a three cycle SDRAM command sequence. Unfortunately, the general internal architecture of conventional SDRAM memory is not the most efficient architecture for non-volatile memories and for Flash memory specifically.

For the reasons stated above, and for other reasons stated below which will become apparent to those skilled in the art upon reading and understanding the present specification, there is a need in the art for a non-volatile memory device that can operate in a manner similar to SDRAM operation and maintain an internal architecture that is more applicable to non-volatile memory device access and power efficiencies.

SUMMARY OF THE INVENTION

The above-mentioned problems with memory devices and other problems are addressed by the present invention and will be understood by reading and studying the following specification.

In one embodiment, a synchronous flash memory device comprises a first memory array with a first memory array dimensionality, a control circuit, and a synchronous memory interface, wherein the control circuit logically adapts the first memory array dimensionality to a second memory array dimensionality.

In another embodiment, a synchronous non-volatile memory device comprises a memory array with a plurality of array banks, each array bank having a first number of rows and a first number of columns, a control circuit, and a synchronous memory interface, wherein, for each array bank of the plurality of array banks, the control circuit logically adapts the first number of rows and the first number of columns to a second number of rows and a second number of columns.

In a further embodiment, a synchronous flash memory device comprises a first memory array with a first memory array dimensionality, a control circuit, wherein the control circuit logically adapts the first memory array dimensionality to a second memory array dimensionality, and a synchronous memory interface. Wherein the synchronous memory interface comprises, an address interface, a data interface, and a control interface.

In yet another embodiment, a synchronous flash memory device comprises a first memory array with a plurality of array banks, each having a first row dimension and a first column dimension, a control circuit, wherein the control circuit logically adapts the first row dimension and the first column dimension of each of the plurality of banks to a second row dimension and a second column dimension, and a synchronous memory interface. Wherein the synchronous memory interface comprises, an address interface, an extended address interface, a data interface, and a control interface.

A method of operating a synchronous flash memory device comprises dividing a memory array with a first memory array dimensionality into a plurality of sections, and logically adapting the plurality of sections of the memory array to form an emulated virtual second memory array dimensionality.

Another method of operating a synchronous flash memory device comprises dividing a memory array with a first memory array dimensionality into a plurality of array banks, dividing each array bank of the plurality of array banks into a plurality of segments, logically adapting the plurality of array banks and plurality of segments of the first memory array dimensionality of the memory array to form an emulated virtual second memory array dimensionality, wherein accessing the emulated virtual second memory array dimensionality occurs through a synchronous memory interface, and allowing access to the first memory array dimensionality of the memory array through the synchronous memory interface and an extended interface.

In yet another method of logically mapping a synchronous non-volatile memory device comprises forming a first memory array with a first plurality of banks, dividing each bank of the first plurality of banks into a plurality of segments, and logically mapping the plurality of segments to appear as a second memory array with a second plurality of segments.

In a further embodiment, a synchronous flash memory device comprises a memory array with a first set of four array banks, such that each array bank has a first number of rows and a first number of columns and each array bank is divided into four segments by row range, a latch circuit, a control circuit, and an SDRAM compatible synchronous memory interface. Wherein the control circuit logically maps the latch circuit and the four segments in each of the four array banks to appear as an emulated virtual SDRAM memory device of an equal memory size with a second virtual set of four array banks, such that the first number of rows and the first number of columns of each array bank of the memory array map to a second number of rows, that is one fourth the first number of rows, and a second number of columns, that is four times the first number of columns, of the second virtual set of four array banks of the emulated virtual SDRAM memory device.

In another method of making a synchronous flash memory device comprises forming a non-volatile memory array with a plurality of array banks, each array bank having a first number of rows and a first number of columns, forming a control circuit, and forming a synchronous interface, wherein the control circuit logically adapts the first number of rows and the first number of columns of each array bank of the plurality of array banks to a second number of rows and a second number of columns.

In another embodiment, a system comprises a synchronous memory controller, and a synchronous flash memory device. Wherein the synchronous flash memory device comprises, a memory array with a first memory array dimensionality, a control circuit, and a synchronous memory interface, wherein the control circuit logically adapts the first memory array dimensionality to a second memory array dimensionality.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

A conventional synchronous Flash memory matches the internal architecture and simulates the operation of an SDRAM memory quite closely. In contrast, a virtual synchronous flash memory of the present invention changes the internal architecture, while maintaining a compatible conventional SDRAM interface. This allows it to better match the efficiencies of the underlying memory technology. The resulting memory structure of a virtual synchronous Flash internal memory array is then logically reassembled to simulate an SDRAM configuration for the purposes of interfacing to a standard SDRAM compatible memory controller, processor, or other compatible external device. The virtual synchronous Flash memory of the present invention allows for additional memory address pins to be added to the external address interface so as to enable external devices with the appropriate capability to access the internal architecture of the virtual synchronous Flash memory directly.

Figure 1:
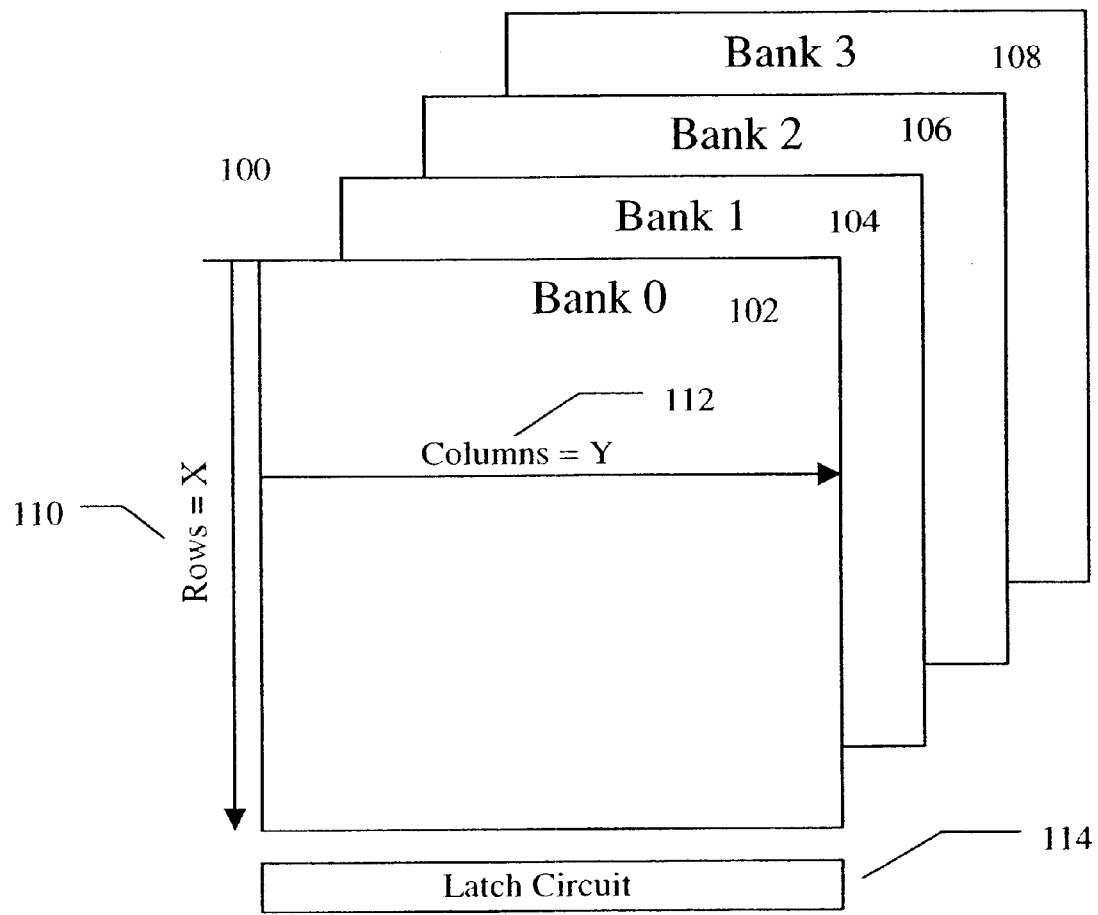
FIG. 1 illustrates a prior art SDRAM memory array with four banks of memory within the array.

FIG. 1 is a simplified diagram of a prior art SDRAM memory array architecture. SDRAM memory arrays generally consist of a sequence of memory array banks that have rows and columns. The SDRAM memory arrays, upon being accessed with a bank, row, and column address, load an internal data latch circuit with a defined number of bits. The SDRAM memory array 100 of FIG. 1 has four array banks 102, 104, 106, and 108. Each of the four banks 102, 104, 106, and 108 in turn has X rows 110 and Y columns 112. When a bank and row are selected by an input row address, the contents of a row of memory cells are placed on column bit lines coupled to sense amplifiers (not shown) and the bit values of the memory cells are detected. The selected memory array row, and therefore the contents of the sense amplifiers, is generally called the active row page. The values detected by the sense amplifiers are latched in latch circuit 114. An input column address to the SDRAM, which defines the column page, selects from the latches of the latch circuit 114, and thus from the columns of the active row page, the Z number of bit values to be latched by an internal data buffer (not shown). The Z data bits are held in the internal data buffer for transfer from the SDRAM memory device through the data interface (not shown). An example of a common SDRAM memory is a 4M×32 SDRAM, which has 4 banks, 4,096 rows, 256 columns, and 32 bits. However, SDRAM memories come in multiple densities and bus widths, for example 8M×8, 4M×16, 4M×32, 2M×32, and 8M×16 to list a few.

An SDRAM memory read operation generally starts with an "ACTIVE" command that sets the bank and row address, by reading in an address placed on the address interface to the SDRAM memory device. The "ACTIVE" command thus activates the active row page and places it on the internal sense amplifiers to be read and latched by internal latch circuits. The column address is read in from the address interface by a following "READ" command that sets the column page by selecting columns from the latch circuits to place in an internal data buffer in the SDRAM memory device. The SDRAM command sequence is then finished on the next clock cycle with a data word transfer from the internal data buffer.

In an SDRAM compatible command sequence, before any READ or WRITE commands can be issued to a bank within the synchronous flash memory, a row in that bank must be "opened." This is accomplished via an ACTIVE command, which is used to open (or activate) a row in a particular array bank for a subsequent access. The value on the BA0, BA1 inputs selects the bank, and the address provided on inputs A0–A11 selects the row. This row remains active for accesses until the next ACTIVE command, power-down or RESET.

A subsequent ACTIVE command to a different row in the same bank can be issued without having to close a previous active row, provided the minimum time interval between successive ACTIVE commands to the same bank is met. A subsequent ACTIVE command to another bank can also be issued while the first bank is being accessed, which results in a reduction of total row access overhead.

After an ACTIVE command to activate a row in the memory, the READ command is used to initiate a read access to an active row. The value on the BA0, BA1 inputs selects the bank, and the address provided on inputs A0–A7 selects the starting column location. Read data appears on data outputs, the DQs (not shown) of the data interface (not shown) subject to the logic level on the data mask (DQM) input that is sometimes used to mask data DQ outputs and values not needed for the current memory access operation.

During READ bursts, the valid data-out element from the starting column address is available following a specified latency after the READ command. In SDRAM compatible memory, each subsequent data-out element is valid by the next positive clock edge. Upon completion of a burst, assuming no other commands have been initiated, all data outputs go as to a high impedance state. A full page burst continues until terminated. (At the end of the page, it wraps to column 0 and continue.) Data from any READ burst may be truncated with a subsequent READ command, and data from a fixed-length READ burst may be immediately followed by data from a subsequent READ command. In either case, a continuous flow of data can be maintained. The first data element from the new burst follows either the last element of a completed burst, or the last desired data element of a longer burst that is being truncated. A READ command can be initiated on any clock cycle following a previous READ command. Full-speed, random read accesses within a page can be performed, or each subsequent READ may be performed to a different bank.

A fixed-length or full-page READ burst can be truncated with either ACTIVE TERMINATE (may or may not be bank specific) or BURST TERMINATE (not bank specific) commands. Data from any READ burst may also be truncated with a subsequent WRITE command (WRITE commands must be preceded by WRITE SETUP), and data from a fixed-length READ burst may be immediately followed by data from a subsequent WRITE command (subject to bus turnaround limitations). The WRITE may be initiated on the clock edge immediately following the last (or last desired) data element from the READ burst, provided that I/O contention can be avoided.

Figure 2:
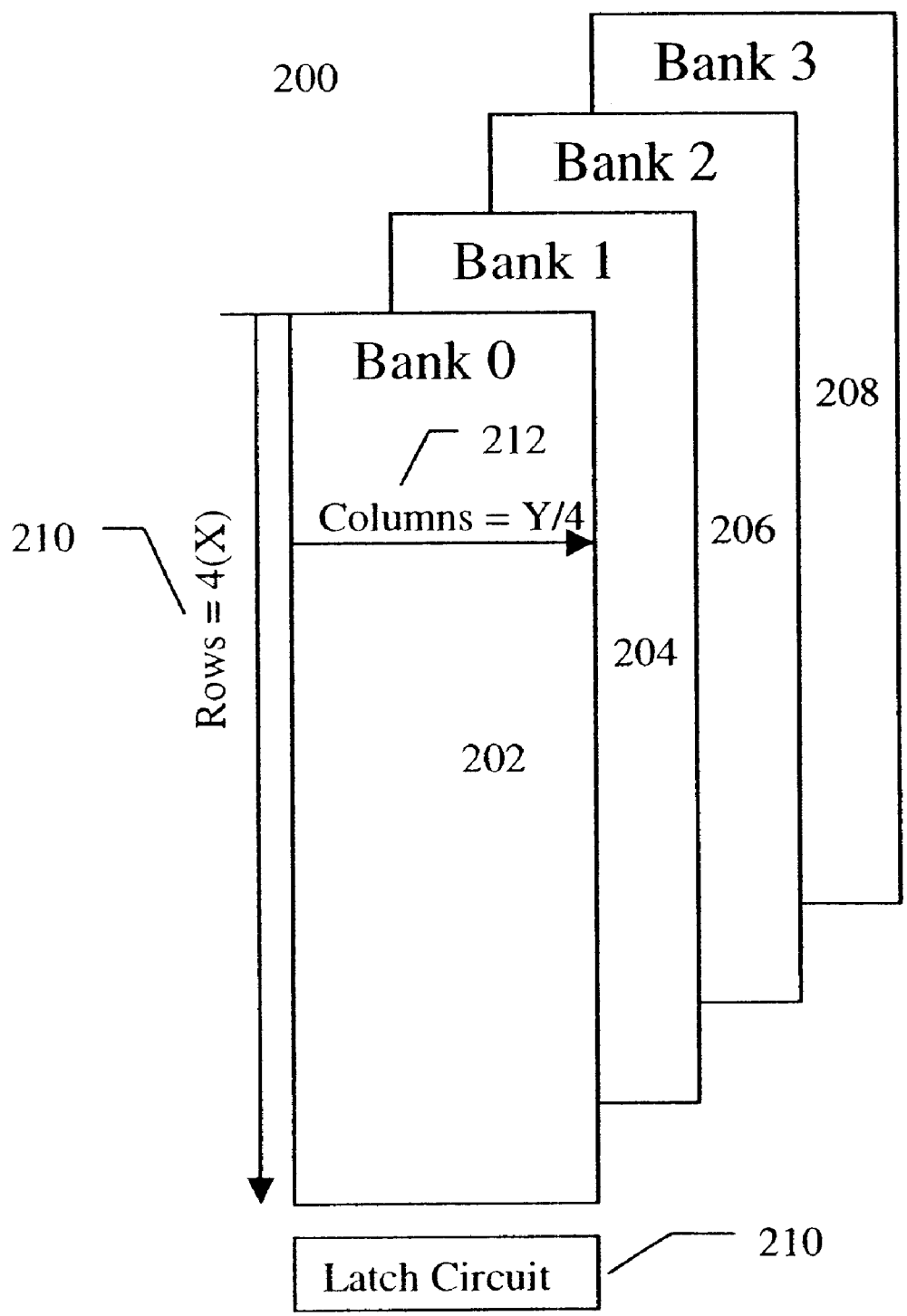
FIG. 2 illustrates a virtual synchronous flash memory array of the present invention with four banks of memory within the array.

As stated above, a virtual synchronous flash memory of the present invention changes the internal architecture, while maintaining a compatible conventional SDRAM interface. This allows it to better match the efficiencies of the underlying memory technology. FIG. 2 details a simplified diagram of a memory array of a virtual synchronous Flash of the present invention. The resulting memory structure of a virtual synchronous Flash internal memory array is then logically reassembled to simulate an SDRAM configuration for the purposes of interfacing to a standard SDRAM compatible memory controller, processor, or other compatible external device. The virtual synchronous Flash memory of the present invention allows for additional memory address pins to be added to the external address interface so as to enable external devices with the appropriate capability to access the internal architecture of the virtual synchronous Flash memory directly.

To accomplish this goal, the virtual synchronous Flash memory of the present invention internally reduces the effective column length of a memory array bank to one-fourth the column length of a corresponding SDRAM memory device. In addition, the number of rows of a memory array bank is increased to four times the number of rows of a corresponding SDRAM memory device, maintaining the same overall memory density. It is noted that other internal memory array configurations are possible and would be apparent to those skilled in the art.

The virtual synchronous Flash memory array 200 of FIG. 2 is shown with four array banks 202, 204, 206, and 208. Each of the four banks 202, 204, 206, and 208 in the memory array in turn has 4(X) rows 210 and Y/4 columns 212. When a bank and row are selected by an input row address, the contents of a row of memory cells is placed on column bit lines coupled to sense amplifiers (not shown) and the bit values of the memory cells are detected. The selected memory array row, and contents of the sense amplifiers, is called the active row page. The values detected by the sense amplifiers are latched in by latch circuit 214. An input column address to the virtual synchronous Flash, which defines the column page, selects from the latches of the latch circuit 214, and thus from the columns of the active row page, the Z number of bit values to be latched by an internal data buffer (not shown). The Z data bits are held in the internal data buffer for transfer from the virtual synchronous Flash memory device through the data interface (not shown). From the above example, a 4M×32 SDRAM, which has 4 banks, 4,096 rows, 256 columns, and 32 bits, would correspond to a 4M×32 virtual synchronous Flash that internally has 4 banks, 16,384 rows, 64 columns, and 32 bits.

Figure 3:
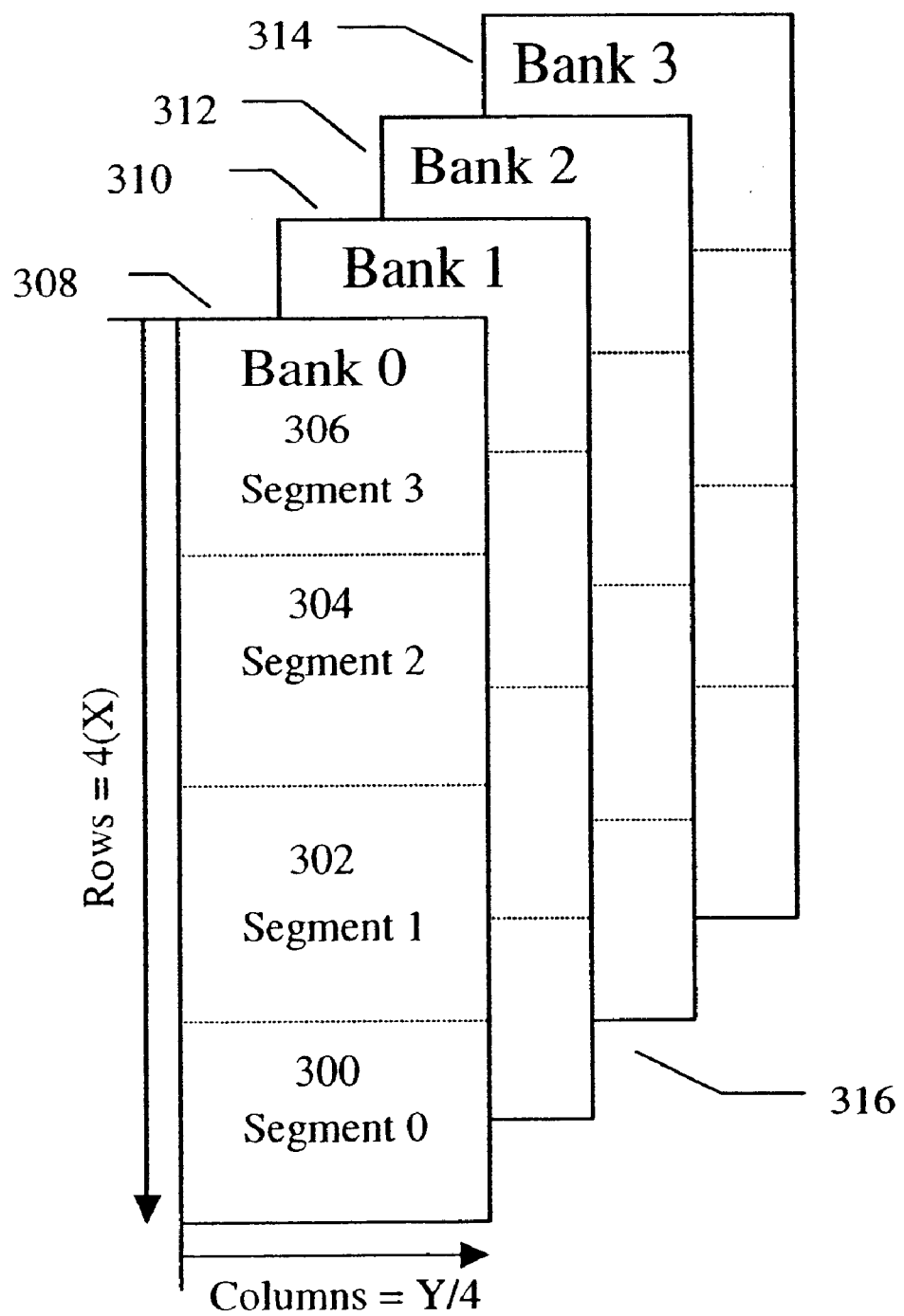
FIGS. 3 and 4 illustrate a virtual synchronous Flash memory array of the present invention subdivided into segments and the segments being mapped into a virtual SDRAM memory array.
Figure 4:
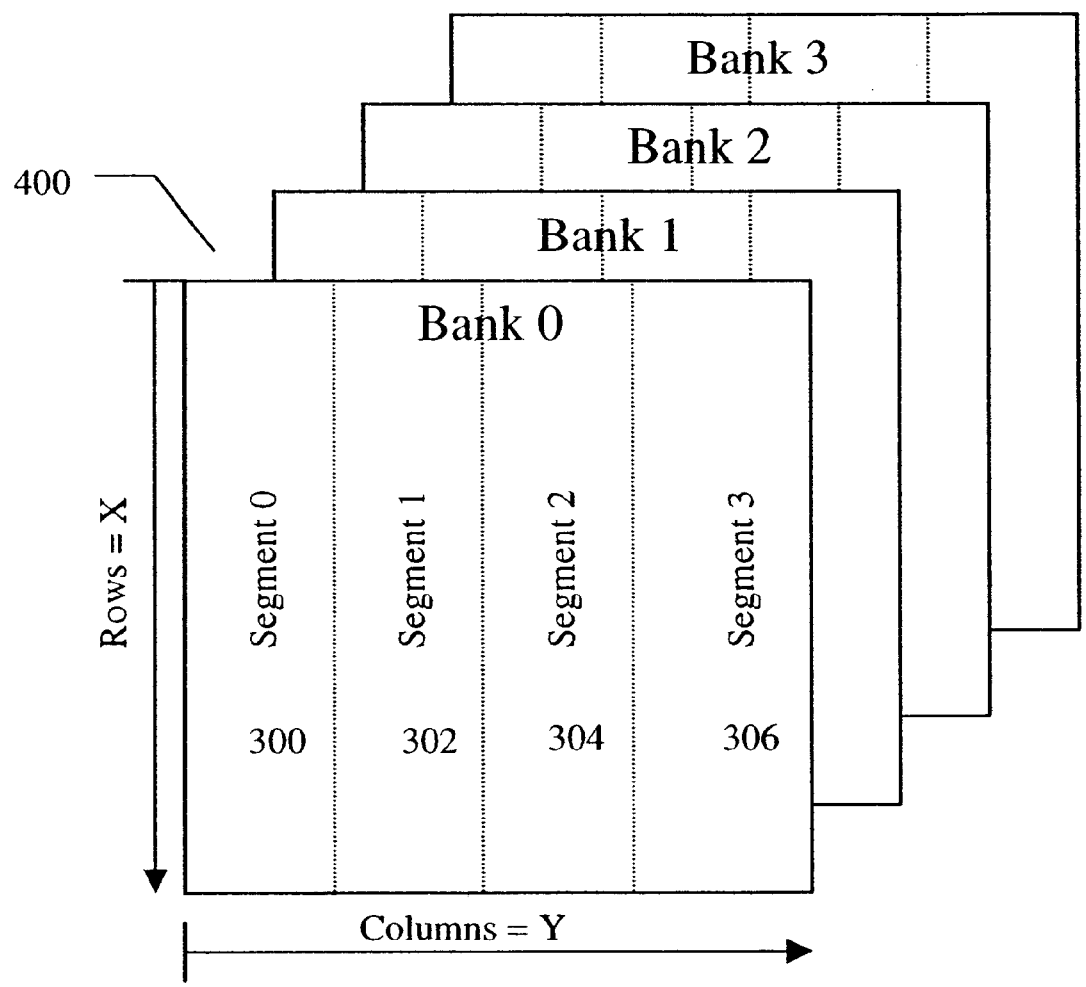

A process for logically reassembling the internal rows and columns of the virtual synchronous Flash of FIG. 2 to map to a comparable conventional SDRAM configuration is shown in FIGS. 3 and 4. In FIG. 3, each of the four banks 308, 310, 312, and 314 of the internal memory array 316 of the virtual synchronous Flash of FIG. 2, which has 4(X) rows and Y/4 columns, is shown in FIG. 3. As detailed in FIG. 2, each of the virtual synchronous Flash internal memory array banks is divided by row range into four segments 300, 302, 304, and 306. The number of rows in each separate segment of FIG. 3 is equal to the overall X number of rows in the SDRAM that the virtual synchronous Flash is compatible with. The segments 300, 302, 304, and 306 of each separate bank of the virtual synchronous Flash are then logically mapped by arranging them in a virtual manner side by side into a corresponding virtual memory bank 400 that is X rows long and Y columns wide, as shown in FIG. 4, matching a corresponding compatible SDRAM device. It is noted that other methods of logically mapping a virtual synchronous Flash memory to match an SDRAM are possible and would be apparent to those skilled in the art with the benefit of the present disclosure.

In the example previously given of a 4M×32 memory device, a 4M×32 virtual synchronous Flash using the technique of FIGS. 3 and 4 internally has 4 banks, 16,384 rows, 64 columns, and 32 bits. Each bank is logically divided into 4 segments of 4,096 rows and 64 columns each. The segments of each bank are logically mapped to form a virtual bank of 4,096 rows and 256 columns. This procedure can be used on each bank to allow the 4M×32 virtual synchronous Flash to simulate a 4M×32 synchronous SDRAM compatible memory device, which has 4 banks, 4,096 rows, 256 columns, and 32 bits.

Figure 5:
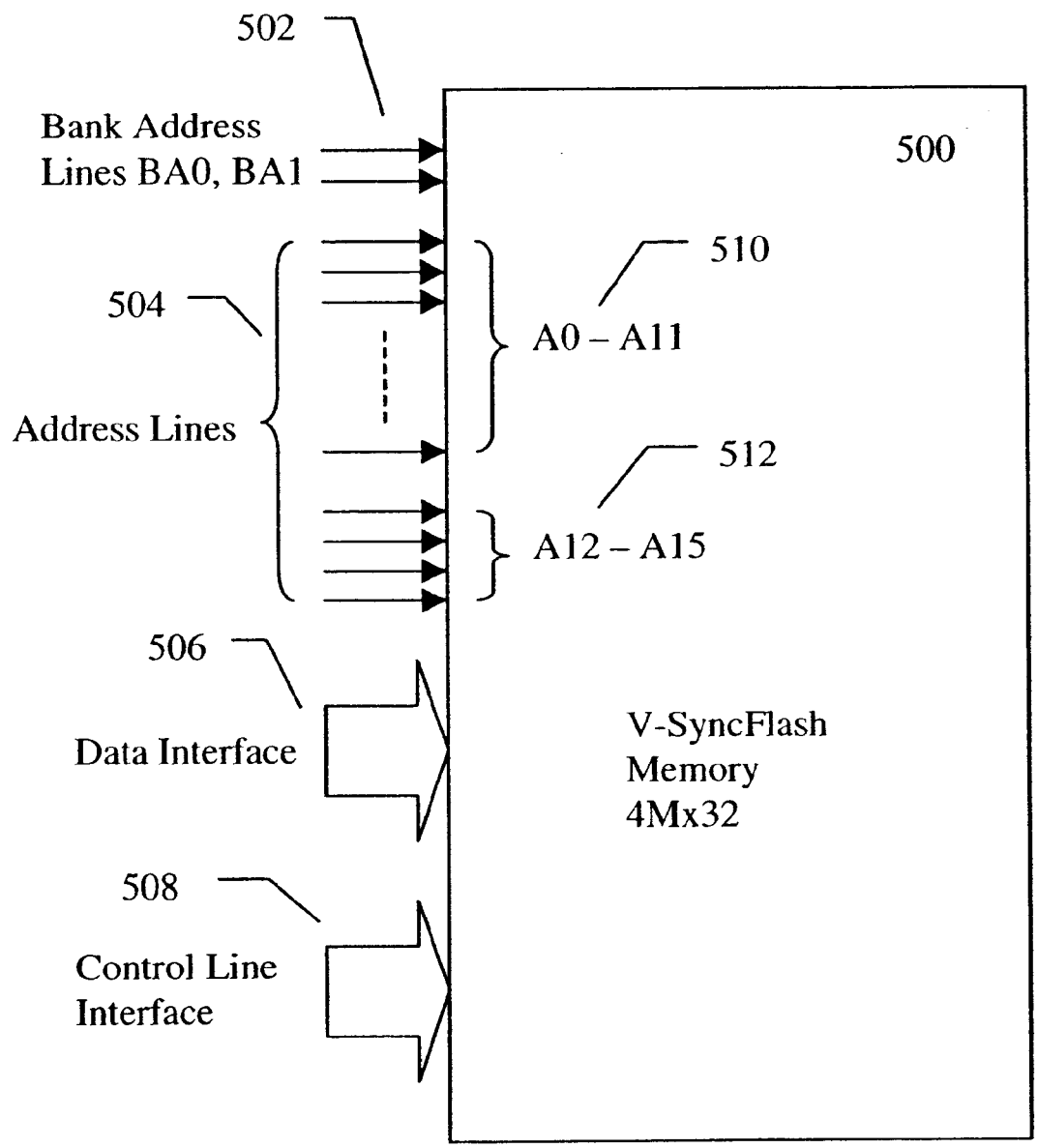
FIG. 5 illustrates a block diagram example of a 4M×32 virtual synchronous Flash memory, showing address, control and data interfaces.

FIG. 5 is a simplified external diagram of a 4M×32 virtual synchronous Flash memory device 500 of an embodiment of the present invention, showing external connections, major interfaces, and extended virtual synchronous Flash address lines. The virtual synchronous Flash memory device 500 of FIG. 5 includes bank address lines BA0–BA1 502, address lines A0–A15 504, data interface 506, and control line interface 508. The bank address lines BA0–BA1 502 select the desired memory array bank for a subsequent access. The data interface 506 transfers data to and from the virtual synchronous Flash memory device 500. The control line interface 508 contains the signal lines necessary to control the virtual synchronous Flash memory device 500 in its operation, such as, but not limited to, CS, DQS, clock, CAS, RAS, and WE. Depending on the SDRAM command being issued the values placed on the address lines A0–A15 504 select the row or column of the memory array for an access. The address lines A0–A15 are additionally split into two separate subsections, A0–A11 510 and A12–A15 512. The addresses in subsection A0–A11 510 allow standard SDRAM compatible row and column memory address accesses to the virtual synchronous Flash memory device 500. The additional address lines in subsection A12–A15 512 are not necessary for SDRAM compatible memory access, but if used by an extended capability SDRAM control device, address lines A12–A15 512 allow access to extended virtual synchronous Flash capabilities and internal architecture. The virtual synchronous Flash uses address lines A12–A13 for access to the extended internal Flash memory array row addresses. Address lines A14–A15 are used to set the extended internal Flash memory array segment address.

A virtual synchronous Flash of the present invention is compatible with conventional SDRAM interfaces and commands, such as detailed above. In addition, virtual synchronous Flash supports extended operations to allow Flash specific operations and to allow direct access to the extended rows and columns of the internal memory array architecture. Direct access to the extended rows and columns without logical re-mapping of the rows and columns to a compatible SDRAM configuration is enabled by the additional address interface lines optionally fitted to the virtual synchronous Flash memory device, such as A12–A15 512 of FIG. 5.

Figure 6:
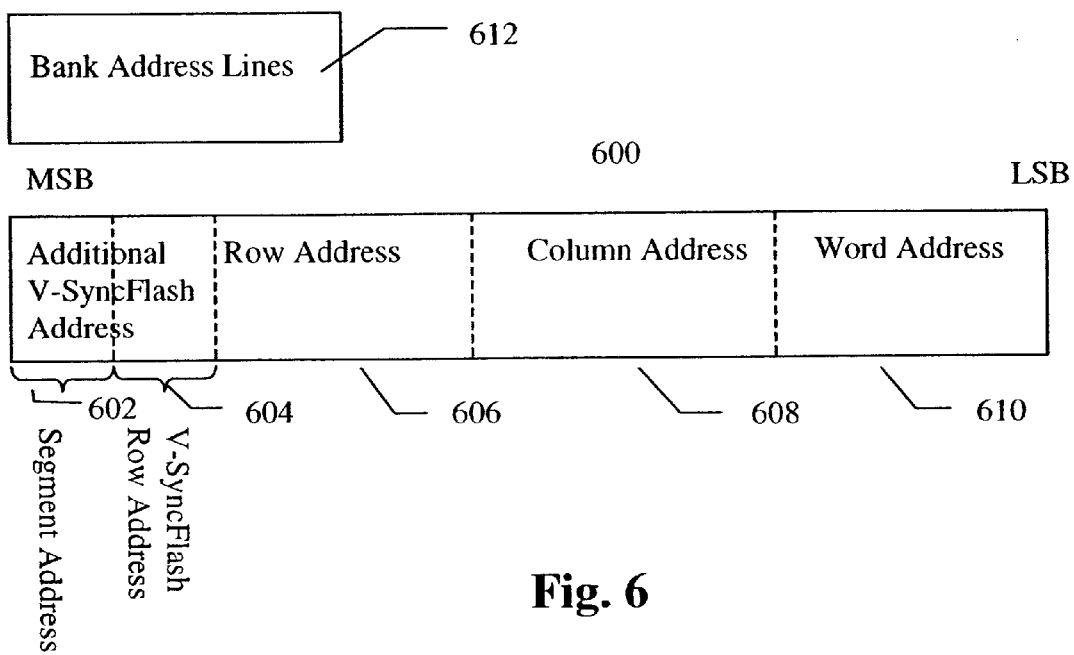
FIG. 6 is a diagram of a memory address for a virtual synchronous Flash, showing bank address, additional virtual synchronous Flash addresses, row address, and column address.

An example of a virtual synchronous Flash address space 600 is shown in FIG. 6. The virtual synchronous Flash address space of FIG. 6 matches the address space of the SDRAM it is compatible with and contains a row address 606, a column address 608, a word address 610, and bank address 612. In addition, the virtual synchronous Flash address space 600 contains extended addresses for segment addressing 602 and row addressing 604 that allow for the direct access of the virtual synchronous Flash without logical mapping by compatible host controllers.

In the example 4M×32 virtual synchronous Flash of FIG. 5, address lines A12–A13 are used for extended row accesses into four times as many physical rows (16,384 rows) that a virtual synchronous Flash has as compared to a compatible conventional 4M×32 SDRAM (4,096 rows). Address lines A14–A15 are used for selecting which segment section of four (i.e., 300, 302, 304, and 306 of FIG. 3) of the virtual synchronous Flash's currently active memory array bank (i.e., 308 of FIG. 3) are accessed in the operation.

Figure 7:
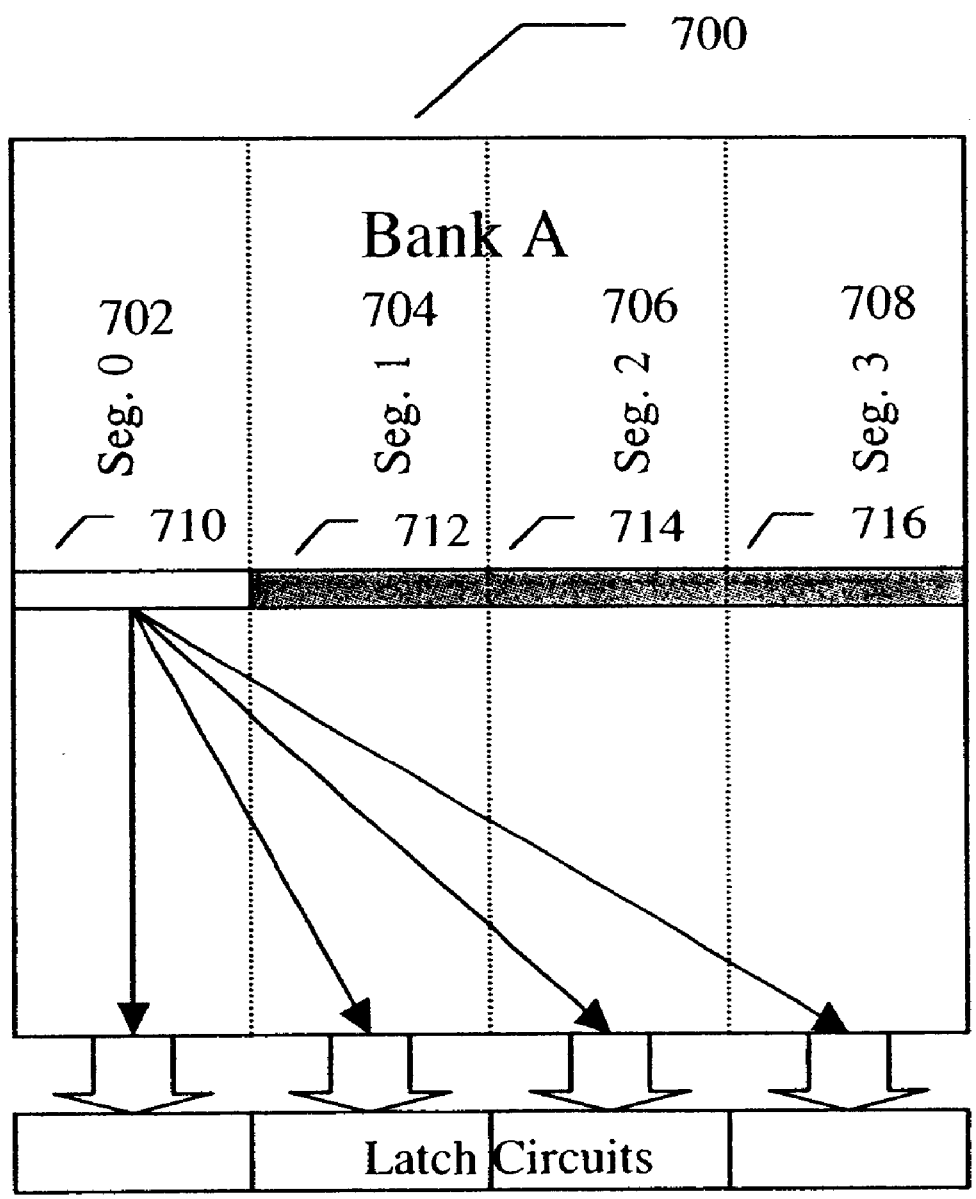
FIG. 7 illustrates a bank of virtual synchronous Flash memory array of the present invention showing mapping of a segment to other segment positions within the bank.

A virtual synchronous Flash memory device's capability to set its segment address allows for full segment association within the bank as shown in FIG. 7. In FIG. 7 is shown a bank of virtual synchronous Flash memory 700 with four segments 702, 704, 706, and 708 that has been logically re-mapped to an SDRAM configuration. A row of the segment zero 710 is shown being logically repositioned by an access that includes an extended virtual synchronous Flash segment address to appear as if it was placed in one of the other three segments of the current memory bank (segment one 712, segment two 714, or segment three 716). The ability of full segment association allows any row selected in a bank to be addressed to any of the four segments in that bank. This has the effect of logically shifting the address space by that number of segments for a subsequent memory access.

In operation, a virtual synchronous Flash memory reduces the active page of the internal memory array bank by one-fourth. This reduces the number of sense amplifiers activating by one-fourth, saving power and complexity. In the example 4M×32 virtual synchronous Flash, the memory device only activates 2K sense amplifiers versus 8K sense amplifiers for an SDRAM or synchronous Flash memory device. In addition, because sixteen segments are available for the virtual synchronous Flash memory device versus four segments for an SDRAM, when each of the four banks has their respective four segments activated, there is a higher hit rate for READs without activating new rows. The increased granularity of a virtual synchronous Flash memory device decreases power usage, and in addition, decreases memory access latency. Therefore effectively increasing bandwidth to the virtual synchronous Flash over that of a conventional synchronous Flash component.

Figure 8:
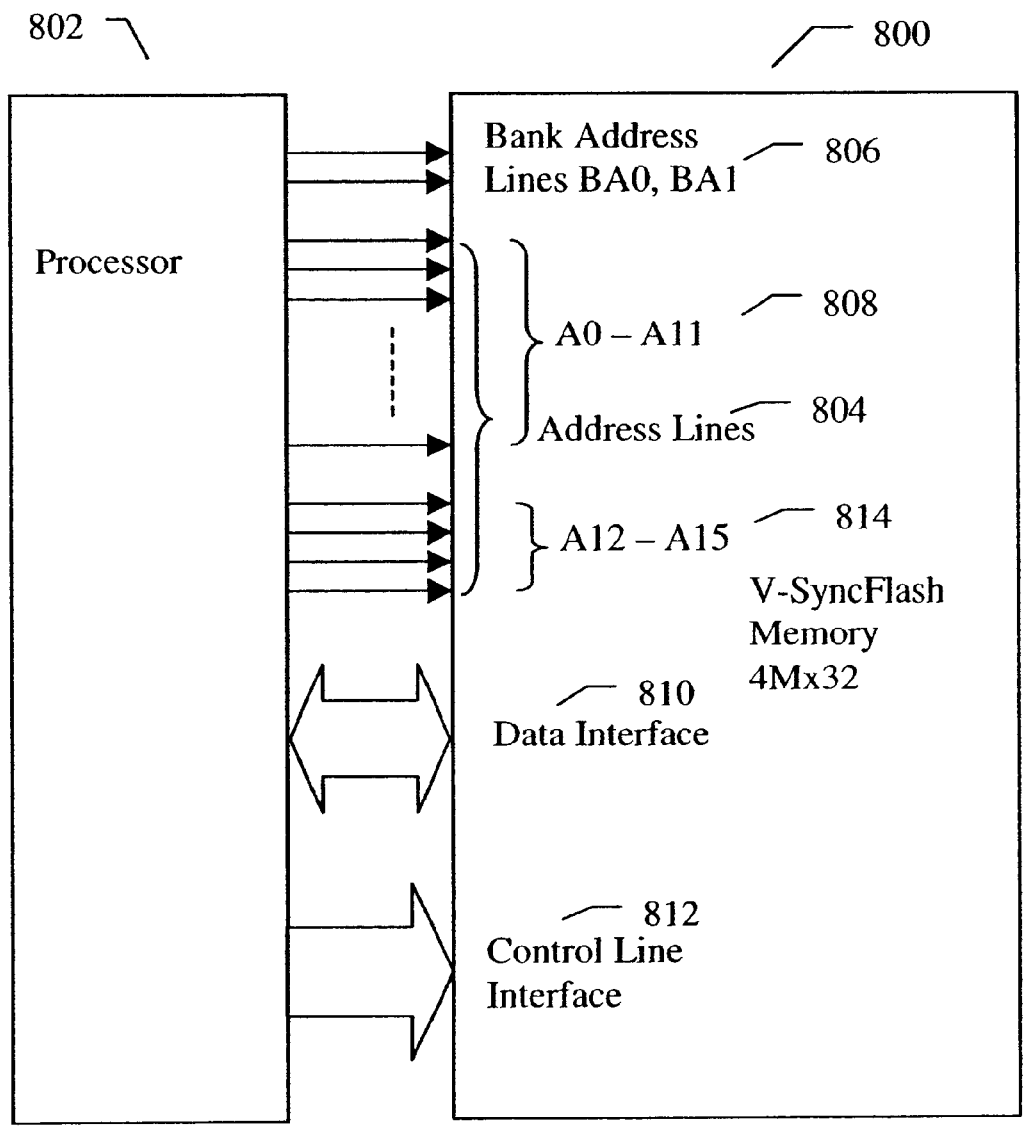
FIG. 8 is a block diagram of a virtual synchronous Flash memory device coupled to an external processor.

FIG. 8 shows an illustration of a virtual synchronous Flash memory system, wherein a 4M×32 virtual synchronous Flash memory device 800 of an embodiment of the present invention is coupled to an external processor 802. It is noted that the virtual synchronous Flash memory system of FIG. 8 is only shown as an example, and other systems and embodiments of the present invention can include multiple types of other integrated circuits (i.e., a memory controller, a field programmable gate array (FPGA), a volatile memory device, an application specific integrated circuit (ASIC), etc.). Systems containing memory devices are well known in the prior art and the following description is intended only to be an overview of their operation and provide an example of their operation with an embodiment of the present invention.

In the system of FIG. 8, address values for the virtual synchronous Flash memory 800 are received from the processor 802 on the external address bus connections 804 and bank address lines 806. The received address values are stored internal to the memory device and utilized to select the memory cells in the internal memory array (not shown). In a conventional SDRAM compatible operation, the processor 802, with an ACTIVE command, inputs a row and bank address on address lines A0–A11 808 and bank address lines BA0 and BA1 806 activating an internal virtual row page (not shown) in the virtual synchronous Flash memory device 800. The row and bank address is followed by a READ command with a column address placed on address lines A0–A8 (a subset of address lines A0–A1 808) by the processor 802. Internal to the virtual synchronous Flash memory device 800, data values from the bank segments (not shown) are captured in latch circuits, logically re-mapped to form an SDRAM compatible data format, and readied for transfer from the virtual synchronous Flash memory device 800. Data transfer from the virtual synchronous Flash memory device 800 begins on the following clock cycle received and transmitted on the bi-directional data word interface 810 to the processor 802. Control of the virtual synchronous Flash memory device 800 for operations is actuated by the internal control circuitry (not shown). The control circuitry operates in response external control signals received from the processor 802 on control signal external interface connections 820 and to internal events.

Extended access to the virtual synchronous Flash memory device 800 is accomplished utilizing the extended virtual synchronous Flash address lines, A12–A15 814. The processor 802, with an ACTIVE command, inputs a row on address lines A0–A11 808, extended row and segment address lines A12–A15 814, and bank address lines BA0 and BA1 806. The ACTIVE command directly activates a bank and internal row page and/or segment of the internal memory array (not shown) in the virtual synchronous Flash memory device 800 for further operations. The row, extended row, and bank address is followed by a READ command with a column address placed on address lines A0–A8 (a subset of address lines A0–A15 804) by the processor 802. Internal to the virtual synchronous Flash memory device 800, data values from the bank segments (not shown) are readied for transfer from the virtual synchronous Flash memory device 800 by being copied into internal latch circuits (not shown). Data transfer from or to the virtual synchronous Flash memory device 800 begins on the following clock cycle received and transmitted on the bi-directional data word interface 810 to the processor 802. Control of the virtual synchronous Flash memory device 800 for operations is actuated by the internal control circuitry (not shown). The control circuitry operates in response external control signals received from the processor 802 on control signal external interface connections 820 and to internal events.

Conclusion

An improved memory device and architecture has been detailed that enhances a Flash memory device that has an SDRAM compatible READ interface. The memory device employs a virtual paging scheme that allows for the architecture of the memory to implement an efficient Flash memory structure internally. Externally, the memory logically maps the internal Flash architecture to an SDRAM compatible interface and virtual architecture, allowing for memory access and operation with a compatible SDRAM controller device. Programming, erasing, block protection, and other Flash specific functions differ from SDRAM and are performed with an SDRAM command sequence.

In one embodiment, a memory device has four times as many rows in a memory array bank as a comparable SDRAM device, but only one fourth as many columns. This reduces the number of sense amplifiers activating, therefore saving power and complexity in the memory device. Internal to the memory, memory array banks are divided into four equal segments by row range and logically re-mapped by placing the segments virtually beside each other. This logically re-mapped memory bank forming a virtual memory bank structure of equivalent rows and columns as the comparable SDRAM device.

In another embodiment, a memory device with an extended memory interface with additional address lines was detailed, allowing for direct access to the internal Flash memory architecture without the abstraction of logical re-mapping the internal memory array. Additionally, the extended interface allows for full bank association and mapping of a segment row of an activated virtual row page to any segment of the bank for a subsequent memory access.

More segments are available for the memory device versus a comparable SDRAM. Therefore, a memory has a higher hit rate for READs without necessitating activation of further new rows. This increases the memory array granularity and has the effect of decreasing power and latency. The improved latency effectively increases the available bandwidth of the memory device.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention.

Therefore, it is manifestly intended that this invention be limited only by the claims and the equivalents thereof.

What is claimed is:

1. A method of making a synchronous flash memory device comprising:
   forming a non-volatile memory array with a plurality of array banks, each array bank having a first number of rows and a first number of columns;
   forming a control circuit; and
   forming a synchronous interface, wherein the control circuit logically adapts the first number of rows and the first number of columns of each array bank of the plurality of array banks to a second number of rows and a second number of columns.

2. The method of claim 1, wherein forming a synchronous interface further comprises forming a synchronous interface, wherein the control circuit logically adapts the first number of rows and the first number of columns of each array bank of the plurality of array banks to emulate a second memory array with a second number of rows and a second number of columns.

3. The method of claim 2, wherein the second row dimension and the second column dimension of each array bank of the plurality of array banks are the same as a SDRAM memory device or a DDR memory device.

4. The method of claim 1, wherein forming a non-volatile memory array with a plurality of array banks, each array bank having a first number of rows and a first number of columns further comprises forming a non-volatile memory array with a plurality of array banks, each array bank comprising a plurality of segments.

5. The method of claim 1, wherein forming a synchronous interface further comprises forming one of a SDRAM or a DDR compatible interface.

6. A method of making a synchronous memory device comprising:
   forming a memory array with a plurality of array banks, each array bank having a first number of rows and a first number of columns;
   forming a control circuit; and
   forming a synchronous interface, wherein the control circuit is adapted to logically map the first number of rows and the first number of columns of each array bank of the plurality of array banks to a second number of rows and a second number of columns.

7. The method of claim 6, further comprising forming an extended interface.

8. The method of claim 7, wherein forming an extended interface further comprises forming an extended address interface.

9. The method of claim 7, wherein the extended interface is adapted to operate in conjunction with the synchronous memory interface.

10. The method of claim 7, wherein the extended interface is adapted to allow access to the first number of rows of each bank.

11. The method of claim 7, wherein the extended interface is adapted to allow extended access to the first number of columns of each bank.

12. The method of claim 8, wherein forming an extended address interface further comprises forming extended address interface having two address lines that are adapted to allow access into the first row dimension of the synchronous flash memory device.

13. The method of claim 10, wherein forming an extended interface further comprises forming an additional address interface that is adapted to allow selection of a segment of an active bank of the synchronous flash memory device.

14. The method of claim 13, wherein forming an additional address interface further comprises forming two address lines that are adapted to select the segment of the active bank of the synchronous flash memory device.

15. The method of claim 13, wherein forming an additional address interface further comprises forming an additional address interface that is adapted to allow association of an active row of a selected segment with any other segment in the active bank of the synchronous flash memory device.

16. A method of making a memory device comprising:
   forming a memory array with a plurality of array banks, each array bank having a first number of rows and a first number of columns;
   forming a control circuit; and
   forming an interface, wherein the control circuit is adapted to logically map the first number of rows and the first number of columns of each array bank of the plurality of array banks to a second number of rows and a second number of columns.

17. The method of claim 16, wherein forming an interface further comprises forming an interface, wherein the control circuit is adapted to logically map the first number of rows and the first number of columns of each array bank of the plurality of array banks to emulate a second memory array with a second number of rows and a second number of columns.

18. The method of claim 17, wherein the second row dimension and the second column dimension of each array bank of the plurality of array banks are the same as a SDRAM memory device or a DDR memory device.

19. The method of claim 16, wherein forming a memory array with a plurality of array banks, each array bank having a first number of rows and a first number of columns further comprises forming a memory array with a plurality of array banks, each array bank comprising a plurality of segments.

20. The method of claim 16, wherein forming an interface further comprises forming one of a SDRAM or a DDR compatible interface.

* * * * *